(12) United States Patent
Mohamed (10) Patent No.: US 11,662,857 B2
(45) Date of Patent: May 30, 2023

(54) TWO-LEVEL CODING/DECODING-BASED TOUCH SENSING DEVICE AND TOUCH SENSING METHOD FOR MUTUAL CAPACITANCE TOUCH SENSOR

(71) Applicant: LX Semicon Co., Ltd., Daejeon (KR)

(72) Inventor: Mohamed Gamal Ahmed Mohamed, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/545,977

(22) Filed: Dec. 8, 2021

(65) Prior Publication Data

US 2022/0187944 A1 Jun. 16, 2022

(30) Foreign Application Priority Data

Dec. 14, 2020 (KR) .......... 10-2020-0174620

(51) Int. Cl.
| | | |
|---|---|---|
| *G06F 3/041* | (2006.01) | |
| *G06F 3/044* | (2006.01) | |
| *G06F 17/14* | (2006.01) | |
| *H03K 19/21* | (2006.01) | |
| *H03M 7/30* | (2006.01) | |
| *H03M 3/00* | (2006.01) | |

(52) U.S. Cl.
CPC .......... *G06F 3/0418* (2013.01); *G06F 3/0446* (2019.05); *G06F 3/04166* (2019.05); *G06F 3/04182* (2019.05); *G06F 3/0412* (2013.01); *G06F 3/04184* (2019.05); *G06F 17/145* (2013.01); *G06F 2203/04108* (2013.01); *H03K 19/21* (2013.01); *H03M 3/468* (2013.01); *H03M 7/70* (2013.01)

(58) Field of Classification Search
CPC .. G06F 3/0418; G06F 3/04166; G06F 3/0446; G06F 3/04184; G06F 17/141; G06F 17/145; G06F 17/147; G06F 2203/04108; G06F 2203/04104; G06F 3/044; G06F 3/04182; G06F 3/0412; G06F 3/04164; G06F 2203/04111; H03M 7/70; H03M 5/04; H03M 3/468; H03K 19/21
See application file for complete search history.

(56) References Cited

U.S. PATENT DOCUMENTS

| | | | |
|---|---|---|---|
| 9,817,537 B1 * | 11/2017 | Shakya | ............... G06F 3/04166 |
| 9,841,841 B2 | 12/2017 | Hwang et al. | |
| 9,916,038 B2 | 3/2018 | Kim | |
| 2011/0234508 A1 * | 9/2011 | Oda | ...................... G06F 3/0446 345/173 |
| 2013/0021294 A1 | 1/2013 | Maharyta et al. | |
| 2014/0055413 A1 * | 2/2014 | Krenik | ................ G06F 3/04166 345/174 |

(Continued)

FOREIGN PATENT DOCUMENTS

| | | | |
|---|---|---|---|
| KR | 10-2016-0087690 A | | 7/2016 |
| KR | 10-2109419 | | 5/2020 |

*Primary Examiner* — Darlene M Ritchie
(74) *Attorney, Agent, or Firm* — Rothwell, Figg, Ernst & Manbeck, P.C.

(57) ABSTRACT

The embodiment applies a two-level coding/decoding technology using a spread spectrum code and an orthogonal code, whereby touch sensing can be robust against noise, a touch sensing time can be reduced, and touch sensitivity can be enhanced.

14 Claims, 11 Drawing Sheets

(56) References Cited

U.S. PATENT DOCUMENTS

| | | | |
|---|---|---|---|
| 2015/0242043 A1* | 8/2015 | Oda | G06F 3/0446 |
| | | | 345/174 |
| 2015/0301631 A1* | 10/2015 | Mirfakhraei | G06F 3/04166 |
| | | | 345/173 |
| 2016/0004357 A1* | 1/2016 | Westhues | G06F 3/04182 |
| | | | 345/174 |
| 2016/0034080 A1* | 2/2016 | Lee | G06F 3/04166 |
| | | | 345/174 |
| 2016/0117051 A1* | 4/2016 | Han | G06F 3/04166 |
| | | | 345/173 |
| 2016/0202839 A1 | 7/2016 | Hwang et al. | |
| 2016/0266716 A1 | 9/2016 | Kim | |
| 2016/0306467 A1* | 10/2016 | Reynolds | H03K 17/962 |
| 2017/0024039 A1 | 1/2017 | Miyamoto | |
| 2018/0129356 A1* | 5/2018 | Leigh | G01S 7/539 |
| 2018/0253183 A1* | 9/2018 | Imanilov | H04L 5/0021 |
| 2019/0102021 A1* | 4/2019 | Jang | G06F 3/0383 |
| 2019/0163312 A1* | 5/2019 | Chen | G06F 3/0416 |
| 2020/0050297 A1* | 2/2020 | Jiang | G06F 3/03545 |
| 2020/0064941 A1 | 2/2020 | Chang et al. | |

\* cited by examiner

TWO-LEVEL CODING/DECODING-BASED TOUCH SENSING DEVICE AND TOUCH SENSING METHOD FOR MUTUAL CAPACITANCE TOUCH SENSOR

CROSS REFERENCE TO RELATED APPLICATION

This application claims priority from Korean Patent Application No. 10-2020-0174620, filed on Dec. 14, 2021, which is hereby incorporated by reference for all purposes as if fully set forth herein.

BACKGROUND

1. Field of Technology

The embodiment relates to a touch sensing technology.

2. Description of the Prior Art

A position sensor is used as an input device of a computer, a personal digital assistant (PDA), a media player, a video game player, a home appliance, a wireless telephone, a public telephone, a point of sales (POS) terminal, an automated teller machine, etc. One of position sensors used in this field to which the position sensor is applied is a touch sensor, and is easily found in an input device of, for example, a laptop computer, a smartphone, etc. A user operates the touch sensor by moving a finger, a stylus, or another object around a detection area of the touch sensor. The object may generate capacitance, inductance, and other electrical effects to a carrier signal applied to the detection area, and the position or proximity of an object in or to the detection area may be detected through the carrier signal. Information on the position detected by the touch sensor may be used to move a cursor or another indicator on a display screen or scroll a textual element on the screen, or used for purposes of other user interfaces.

For a few years, touch sensors have been used, but engineers have continuously sought design alternatives which can reduce costs and enhance performance of the touch sensor. Specifically, there has been significant attention recently to reduction in the influence of noise generated by a display screen, a power source, wireless frequency interference, and/or another source external to a sensor. Various types of sampling, filtering, signal processing, shielding, and other noise reduction technology have been implemented with various levels of success.

Accordingly, there is a need to provide a system and a method for promptly, effectively, and efficiently detecting a position-based attribute of an object in a situation where noise is introduced.

SUMMARY OF THE INVENTION

In this background, the embodiment is to provide, in an aspect, a touch sensing technology which is robust against noise. In another aspect, the embodiment is to provide a technology of simultaneously driving multiple touch sensors for touch sensing time reduction and touch sensitivity enhancement.

In order to achieve the objective mentioned above, in an aspect, the embodiment provides a touch sensing method for mutual capacitance touch sensors formed by multiple transmission electrodes and a reception electrode intersecting each other, the method including: coding a base signal with a spread spectrum code to generate a spread spectrum signal; coding the spread spectrum signal with multiple orthogonal codes, which are orthogonal to each other, to generate multiple driving signals; supplying the driving signals to the transmission electrodes, respectively; receiving a response signal for the driving signals from the reception electrode; converting the response signal into a digital response signal through analog-digital conversion; decoding the digital response signal with the orthogonal codes and the spread spectrum code to generate sensing data for each of the touch sensors; and determining a touch or proximity of an external object to the touch sensors by using the sensing data.

In another aspect, the embodiment provides a touch sensing device for mutual capacitance touch sensors formed by multiple transmission electrodes and a reception electrode intersecting each other, the device including: a driving circuit configured to code a base signal with a spread spectrum code to generate a spread spectrum signal, to code the spread spectrum signal with multiple orthogonal codes, which are orthogonal to each other, to generate multiple driving signals, and to supply the driving signals to the transmission electrodes, respectively; and a sensing circuit configured to receive a response signal for the driving signals from the reception electrode, to convert the response signal into a digital response signal through analog-digital conversion, to decode the digital response signal with the orthogonal codes and the spread spectrum code to generate sensing data for each of the touch sensors, and to determine a touch or proximity of an external object to the touch sensors by using the sensing data.

The sensing circuit may decode the digital response signal with the spread spectrum code to generate a first decoding signal, summate the first decoding signal at each unit time of the orthogonal codes to generate a second decoding signal, and decode the second decoding signal with the orthogonal codes to generate the sensing data.

In another aspect, the embodiment provides a touch sensing device for a mutual capacitance touch sensor formed by a reception electrode and a transmission electrode intersecting each other, the device including: a driving circuit configured to supply a pulse signal including a high voltage level interval and a low voltage level interval to the transmission electrode; and a sensing circuit configured to receive a response signal for the pulse signal from the reception electrode, to reverse a part of the response signal, the part corresponding to the high voltage level interval or the low voltage level interval, to convert the response signal into a digital response signal through analog-digital conversion, and to generate sensing data for the touch sensor by using the digital response signal.

The pulse signal may correspond to a signal coded with a spread spectrum signal, and the sensing circuit may decode the digital response signal with the spread spectrum code to generate the sensing data.

According the embodiment described above, touch sensing can be robust against noise. In addition, according to the embodiment, multiple touch sensors may be simultaneously driven, whereby a touch sensing time can be reduced or touch sensitivity can be enhanced.

DETAILED DESCRIPTION OF THE EXEMPLARY EMBODIMENTS

Figure 1:
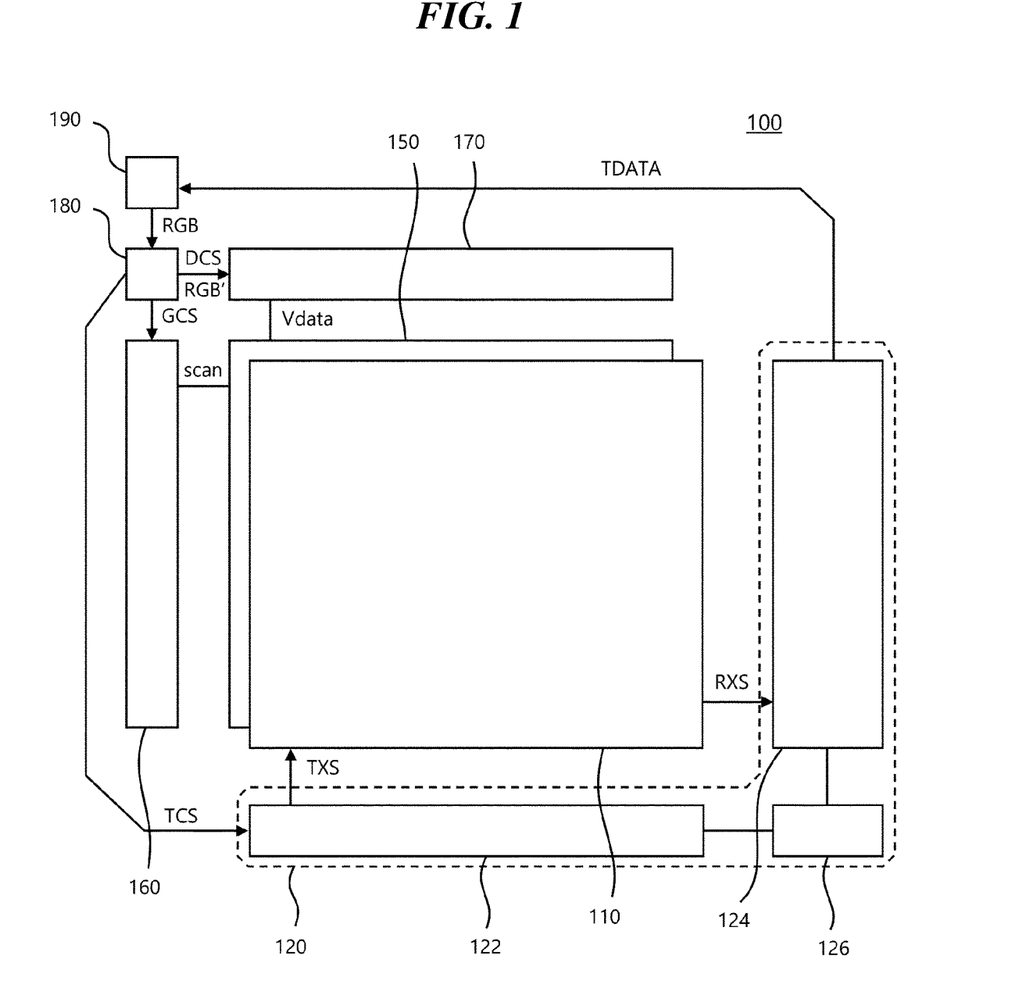
FIG. 1 is a block diagram of a display device according to an embodiment.

FIG. 1 is a block diagram of a display device according to an embodiment.

Referring to FIG. 1, a display device 100 may include a display panel 150, a gate driving device 160, a data driving device 170, a data processing device 180, a host 190, a touch panel 110, and a touch sensing device 120

The data driving device 170, the gate driving device 160, and the touch sensing device 120 may drive at least one element included in the display panel 150 or the touch panel 110. The data driving device 170 may drive a data line connected to a pixel in the display panel 150, and the gate driving device 160 may drive a gate line connected to a pixel. The touch sensing device 120 may drive touch electrodes arranged on the touch panel 110.

The data driving device 170 may supply a data voltage (Vdata) to the data line to display an image on each pixel of the display panel 150. The data driving device 170 may include at least one data driver integrated circuit, wherein the at least one data driver integrated circuit may be connected to a bonding pad of the display panel 150 in a tape automated bonding (TAB) manner or a chip on glass (COG) manner, or may be directly disposed on the display panel 150, and in some cases, may be integrated into the display panel 150. The data driving device 170 may be also implemented in a chip on film (COF) manner.

The gate driving device 160 may supply a scan signal to the gate line to turn on or off a transistor positioned in each pixel. According to an operation manner, the gate driving device 160 may be positioned only at one side of the display panel 150 as shown in FIG. 1, or may be divided into two parts to be positioned at opposite sides of the display panel 150. In addition, the gate driving device 160 may include at least one gate driver integrated circuit, wherein the at least one gate driver integrated circuit may be connected to a bonding pad of the display panel 150 in a TAB manner or a COG manner, or may be implemented in a gate in panel (GIP) type to be directly disposed on the display panel 150, and in some cases, may be integrated into the display panel 150. In addition, the gate driving device 160 may be also implemented in COF manner.

The data processing device 180 may receive image data (RGB) from the host 190, and convert the image data into a form which can be recognized by the data driving device 170. The data processing device 180 may transmit the converted image data (RGB') to the data driving device 170.

The data processing device 180 may control a timing of each driving device 160, 170, or 120 through a control signal (GCS, DCS, or TCS). In this respect, the data processing device 180 may be called a timing controller.

The touch panel 110 may have touch electrodes arranged thereon. Each of the touch electrodes may include a transmission electrode and a reception electrode. The touch sensing device 120 may transmit a driving signal (TXS) to the transmission electrode and receives a response signal (RXS) from the reception electrode to generate touch data (TDATA). The touch sensing device 120 may transmit the touch data (TDATA) to the host 190. The transmission electrode and the reception electrode may be identical to or different from each other. Hereinafter, an embodiment in which the transmission electrode and the reception electrode, as two different electrodes, are coupled to each other by capacitance is described, but the disclosure is not limited thereto.

The touch sensing device 120 may include a driving circuit 122, a sensing circuit 124, and a control circuit 126. The driving circuit 122 may transmit a driving signal (TXS) to the transmission electrode. The control circuit 126 may transmit a timing signal to the driving circuit 122 and the sensing circuit 124. The sensing circuit 124 may receive a response signal (RXS) from the reception electrode, and analyze the response signal (RXS) to generate touch data (TDATA).

The touch sensing device 120 may be coupled to the touch panel 110 to constitute a touch system.

Figure 2:
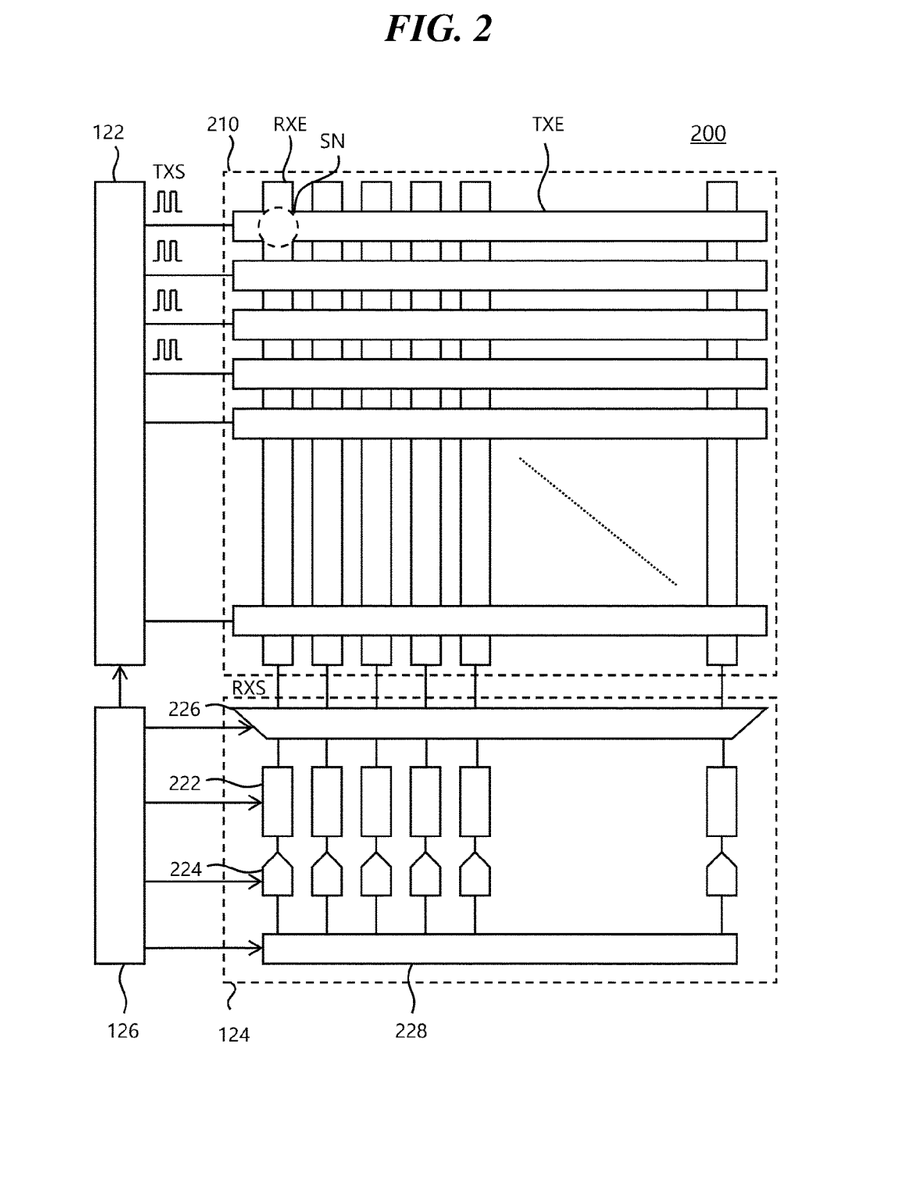
FIG. 2 is a block diagram of an example of a touch system according to an embodiment.

FIG. 2 is a block diagram of an example of a touch system according to an embodiment.

Referring to FIG. 2, the touch panel 210 may have the transmission electrode (TXE) and the reception electrode (RXE) arranged thereon. The transmission electrode (TXE) and the reception electrode (RXE) may cross each other and may be arranged in horizontal and vertical directions. The touch panel 210 may have a quadrilateral shape overall, but the embodiments are not limited to the shape.

The driving circuit 122 may supply a driving signal (TXS) to the transmission electrode (TXE). The sensing circuit 124 may receive a response signal (RXS) from the reception electrode (RXE), and modulates the response signal (RXS) to generate touch data (TDATA). The transmission electrode (TXE) and the reception electrode (RXE) may be coupled by capacitance, wherein the driving signal (TXS) supplied to the transmission electrode (TXE) may derive the response signal (RXS) to the reception electrode (RXE) through coupling capacitance.

The driving circuit 122 may perform multi-driving for multiple transmission electrodes (TXEs). Here, the multi-driving may mean simultaneously driving the multiple transmission electrodes (TXEs). When the touch system 200 uses the multi-driving, the multiple transmission electrodes (TXEs) may be simultaneously driven, and thus an overall touch driving time can be reduced, and the length of the driving signal (TXS) supplied to each of the transmission electrodes (TXEs) may increase, whereby touch sensitivity (signal to noise ratio (SNR)) can be enhanced.

The driving circuit 122 may divide all transmission electrodes (TXEs) into multiple groups, and may perform multi-driving of the transmission electrodes (TXEs) for each of the groups. For example, when there are a total of 48 transmission electrodes (TXEs) arranged on the touch panel 210, the driving circuit 122 may divide all the transmission electrodes (TXEs) into 12 groups, and may assign four transmission electrodes (TXEs) to each of the groups. The driving circuit 122 may simultaneously drive four transmission electrodes (TXEs) assigned to each of the groups.

The driving circuit 122 may simultaneously transmit the driving signals (TXSs) that are orthogonally modulated, to each of the transmission electrodes (TXEs) belonging to a group. The orthogonally modulated multiple driving signals (TXSs) may be distinguished from each other through a modulation process even though orthogonally modulated multiple driving signals (TXSs) overlap with one response signal (RXS). The sensing circuit 124 may modulate the response signal (RXS) received through the reception electrode (RXE) to distinguish an influence of each of the driving signals (TXSs).

Here, the orthogonally modulated driving signals (TXSs) may correspond to driving signals indicating different codes. The modulation scheme may be called a code division multiplexing (CDM) scheme. Each of the driving signals (TXSs) may have codes that are orthogonal to each other, wherein a value obtained by multiplying two orthogonal codes may be zero.

The driving circuit 122 may perform time-division driving for each of the groups. The driving circuit 122 may perform multi-driving for a first group in a first time interval, and may perform multi-driving for a second group in a second time interval, wherein the second group does not overlap the first group.

The sensing circuit 124 may include a readout circuit 222, an analog-digital converter (ADC) 224, and a multiplexer (MUX) 226.

The MUX 226 may select one of multiple reception electrodes (RXEs) according to timing signal of the control circuit 126, and may receive a response signal (RXS) from the selected reception electrode (RXE).

The readout circuit 222 corresponds to a circuit which converts the response signal (RXS) in an analog manner, and may include a circuit such as an integrator. The analog-digital converter 224 may convert an output of the readout circuit 222 into a digital signal (hereinafter, referred to as a "digital response signal").

A processing circuit 228 may process the digital response signal to generate sensing data for each touch sensor, and may determine a touch or proximity on or to touch sensors by an external object, by using the sensing data. Here, the touch sensor may correspond to an intersection point (SN) of the transmission electrode (TXE) and the reception electrode (RXE).

The control circuit 126 may transmit a timing signal to the driving circuit 122, the sensing circuit 124, and the processing circuit 228. The driving circuit 122 and the sensing circuit 124 may transmit the driving signal (TXS) and receive the response signal (RXS), according to the timing signal.

The driving circuit 122 may apply a spread spectrum technology to the driving signal (TXS) to avoid noise having specific frequency or reduce electromagnetic interference (EMI).

The driving circuit 122 may transmit a signal coded with a spread spectrum code as the driving signal (TXS). The sensing circuit 124 may decode the response signal (RXS) with the spread spectrum code to generate sensing data.

The driving circuit 122 may code the driving signal (TXS) with the spread spectrum code for noise avoidance and EMI reduction and an orthogonal code for multi-driving, and in this aspect, a touch system according to an embodiment applies a two-level coding/decoding technology.

Figure 3:
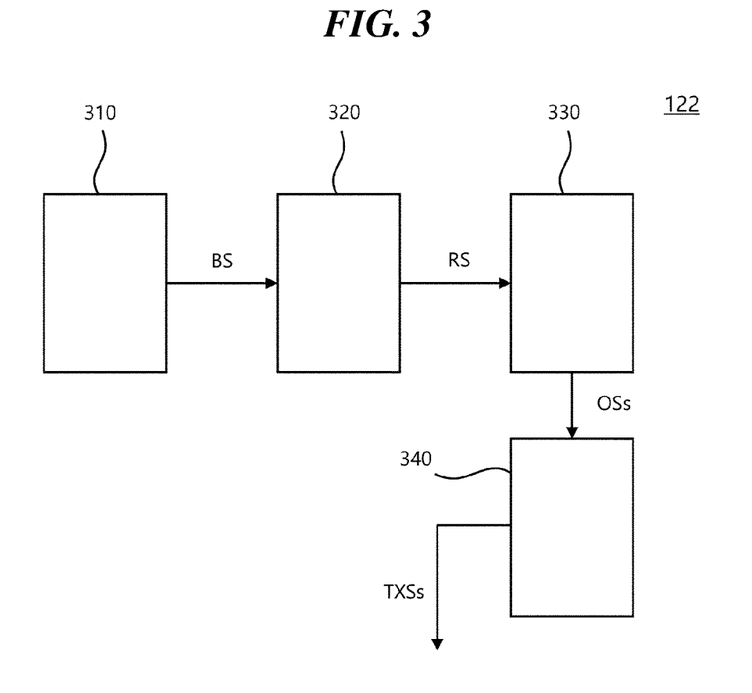
FIG. 3 is a block diagram of a driving circuit according to an embodiment.

FIG. 3 is a block diagram of a driving circuit according to an embodiment.

Referring to FIG. 3, the driving circuit 122 may include a base signal generation circuit 310, a spread spectrum coding circuit 320, an orthogonal coding circuit 330, and an output circuit 340.

The base signal generation circuit 310 may generate a base signal (BS) as a signal forming a base of a driving signal (TXS). The base signal (BS) may have a waveform such as a square wave, a triangle wave, and a sine wave. The base signal (BS) may be a periodic signal. The periodic signal corresponds to a signal having the same waveform repeating at a predetermined period. Hereinafter, for convenience of description, description is made based on an example in which the base signal (BS) is a periodic pulse signal.

The spread spectrum coding circuit 320 may code the base signal (BS) with a spread spectrum code to generate a spread spectrum signal (RS). The spread spectrum signal (RS) may mean a signal having a wide frequency band and a lower signal strength in all bands at the time of frequency analysis. The spread spectrum signal (RS) has a wide frequency band and a low signal strength in all bands, and thus EMI may be low, and an influence from noise having a specific frequency may be small.

The spread spectrum code may be a pseudo-noise (PN) code. The spread spectrum code, as a pseudo-random code, may include a maximum length sequence, a Parker code, or a Gold code.

The orthogonal coding circuit 330 may code the spread spectrum signal (RS) with orthogonal codes to generate orthogonal signals (OSs). Here, the orthogonal codes are codes that orthogonal to each other and may correspond to a perfect code or a Hadamard code. The orthogonal coding circuit 330 may generate multiple orthogonal signals (OSs) with a single base signal (BS) through the two-level coding.

The output circuit 340 may generate driving signals (TXSs) according to the multiple orthogonal signals (OSs), and supply the driving signals (TXSs) to the transmission electrodes.

Figure 4:
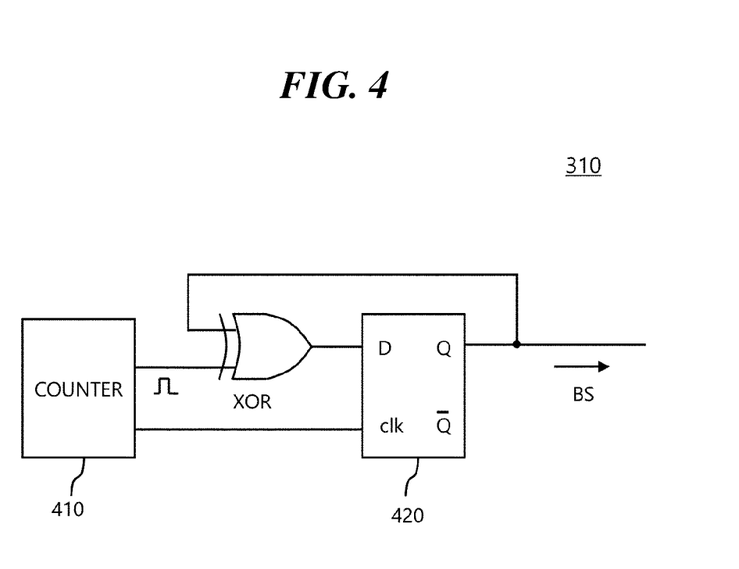
FIG. 4 is a block diagram of a base signal generation circuit according to an embodiment.

FIG. 4 is a block diagram of a base signal generation circuit according to an embodiment.

Referring to FIG. 4, a base signal generation circuit 310 may include a counter 410, an XOR logical circuit, and a DQ flip-flop 420.

The common clock may be input for the counter 410 and the DQ flip-flop 420. The counter 410 may count a clock, output a first pulse from a first count value to the DQ flip-flop 420 through the XOR logical circuit, and output a second pulse from a second count value to the DQ flip-flop 420 through the XOR logical circuit.

A D-terminal of the DQ flip-flop 420 may be connected to an output of the XOR logical circuit, one terminal of the XOR logical circuit may be connected to an output of the counter 410, and the other terminal of the XOR logical circuit may be connected to a Q-terminal of the DQ flip-flop 420.

According to the configuration above, a pulse signal having a high voltage level interval corresponding to the first count value and a low voltage level interval corresponding to the second count value may be output from the Q-terminal of the DQ flip-flop 420. The pulse signal may be used as a base signal (BS).

The base signal generation circuit 310 may determine a signal period of the base signal (BS) according to a sum of the first count value and the second count value, determine the length of the high voltage level interval according to the first count value, and determine the length of the low voltage level interval according to the second count value.

Figure 5:
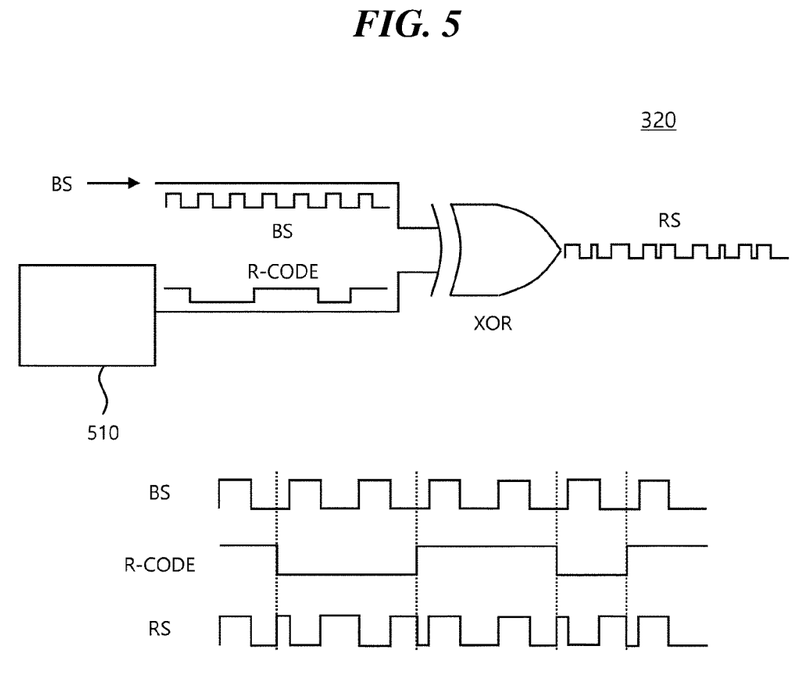
FIG. 5 is a block diagram of a spread spectrum coding circuit according to an embodiment.

FIG. 5 is a block diagram of a spread spectrum coding circuit according to an embodiment.

Referring to FIG. 5, the spread spectrum coding circuit 320 may include a spread spectrum code sequence generator 510 and an XOR logical circuit.

The spread spectrum code sequence generator 510 may generate a spread spectrum code sequence (R-CODE). The spread spectrum code sequence generator 510 may include several DQ flip-flops and XOR logical circuits, and may generate a maximum length sequence, a Parker code sequence, a Gold code sequence, or the like.

The XOR logical circuit may generate a spread spectrum signal (RS) by performing an XOR logical operation on the spread spectrum code sequence (R-CODE) and the base signal (BS).

Figure 6:
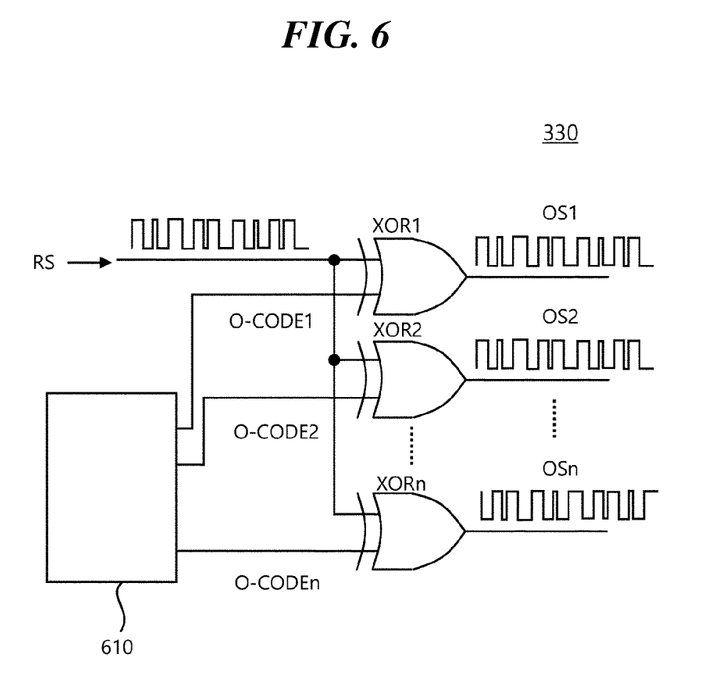
FIG. 6 is a block diagram of an orthogonal coding circuit according to an embodiment.

FIG. 6 is a block diagram of an orthogonal coding circuit according to an embodiment.

Referring to FIG. 6, the orthogonal coding circuit 330 may include an orthogonal code sequence generator 610 and multiple XOR logical circuits (XOR1 to XORn).

The orthogonal code sequence generator 610 may generate multiple orthogonal code sequences (O-CODE1 to O-CODEn) generated with codes that are orthogonal to each other.

The XOR logical circuits (XOR1 to XORn) may generate orthogonal signals (OS1 to OSn), respectively, by performing an XOR logical operation on the spread spectrum signal (RS) and the orthogonal code sequences (O-CODE1 to O-CODEn).

Figure 7:
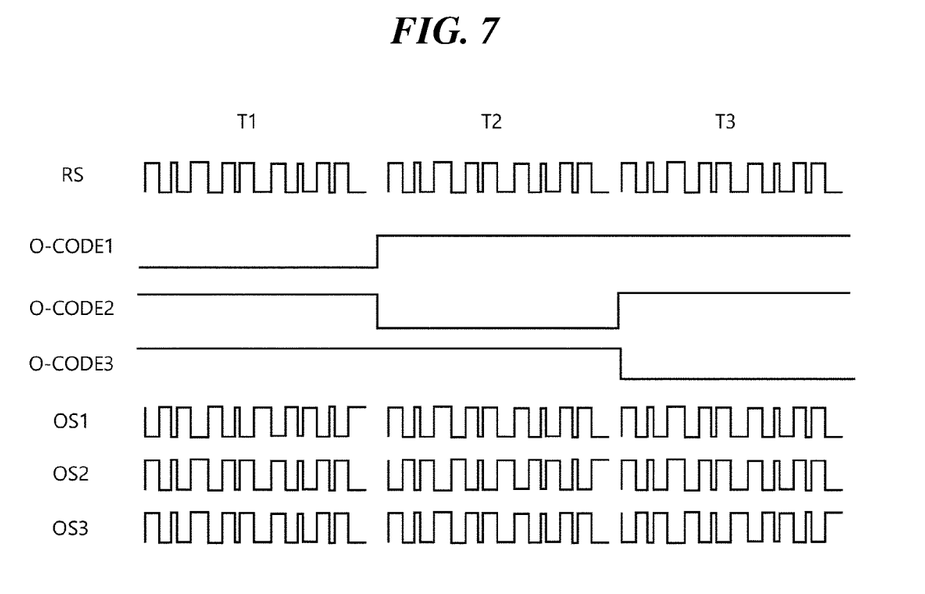
FIG. 7 illustrates main signal waveforms of FIG. 6.

FIG. 7 illustrates main signal waveforms of FIG. 6.

Referring to FIG. 7, the spread spectrum signal (RS) may repeat at each unit time (T1, T2, or T3) of orthogonal codes. Orthogonal signals (OS1 to 0S3) may be generated according to an XOR logical operation on the spread spectrum signal (RS) and the orthogonal code sequences (O-CODE1 to O-CODE3).

Figure 8:
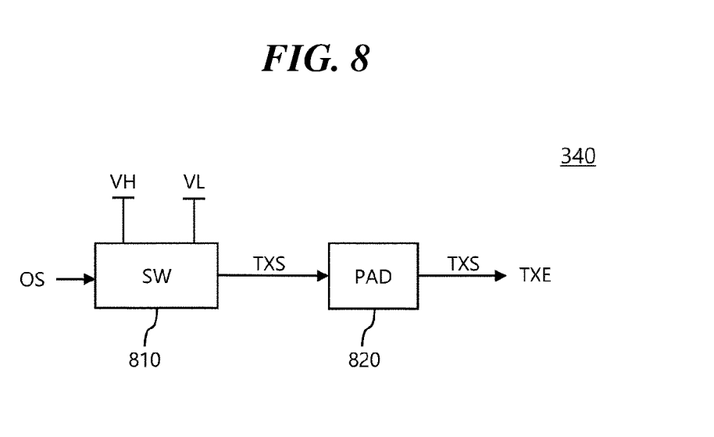
FIG. 8 is a block diagram of an output circuit according to an embodiment.

FIG. 8 is a block diagram of an output circuit according to an embodiment.

Referring to FIG. 8, the output circuit 340 may include a switch circuit 810 and an output terminal 820.

The switch circuit 810 may receive a high driving voltage (VH) and a low driving voltage (VL), and output one of the high driving voltage (VH) and the low driving voltage (VL) according to an orthogonal signal (OS). A driving signal (TXS) is generated according to the output, and the driving signal (TXS) may be supplied to the transmission electrode (TXE) through the output terminal 820.

Detailed examples of a driving circuit are described with reference to FIGS. 3 to 8, and as shown in the examples, the driving circuit may be simply implemented through an XOR logical circuit, a DQ flip-flop, a counter, and the like.

A driving signal may be implemented in various forms. The driving signal may include unit signals each indicating 1 or 0, wherein the unit signals may be classified into 1 or 0 according to polarity or a phase.

Figure 9:
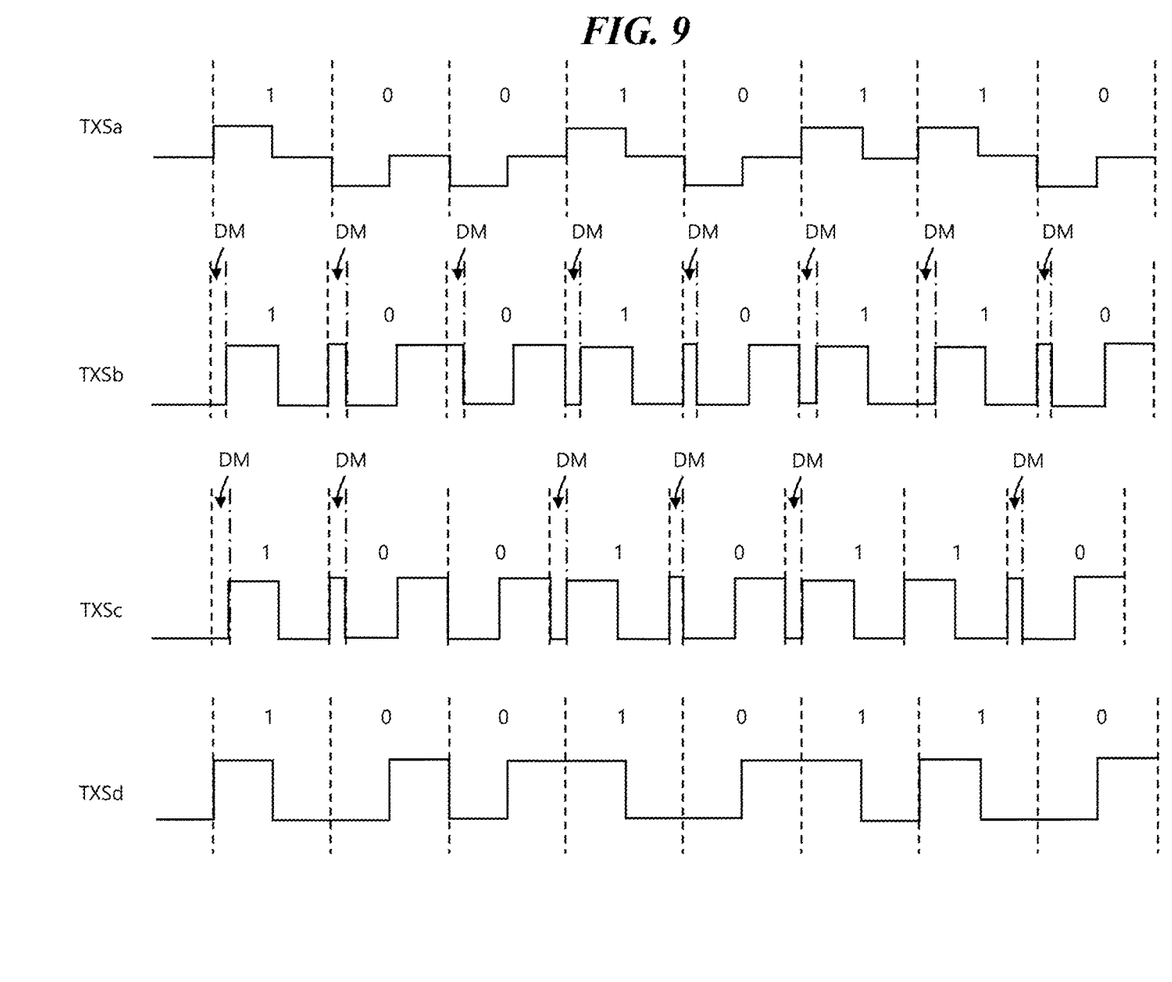
FIG. 9 illustrates an example of driving signals according to an embodiment.

FIG. 9 illustrates an example of driving signals according to an embodiment.

In FIG. 9, units signals constituting a driving signal are arranged in intervals between dotted lines. Each of the unit signals may indicate 1 or 0.

Each of the unit signals may be formed in various forms. In FIG. 9, referring to the first exemplary driving signal (TXSa), each of the unit signals may be classified into 1 or 0 according to polarity.

In FIG. 9, referring to the second exemplary driving signal (TXSb), the third exemplary driving signal (TXSc), and the fourth exemplary driving signal (TXSd), each of the unit signals may be classified into 1 or 0.

When each of the unit signals is classified into 1 or 0 according the phase, a dummy signal (DM) may be further inserted into each of the unit signals. In FIG. 9, referring to the second exemplary driving signal (TXSb), a dummy signal (DM) may be further inserted into each of the unit signals. In FIG. 9, referring to the third exemplary driving signal (TXSc), a dummy signal (DM) may be only inserted between two unit signals having different values.

A response signal may be generated in a falling edge and a rising edge of the driving signal, wherein the dummy signal (DM) has a function of generating the falling edge and the rising edge for each of the unit signals.

Figure 10:
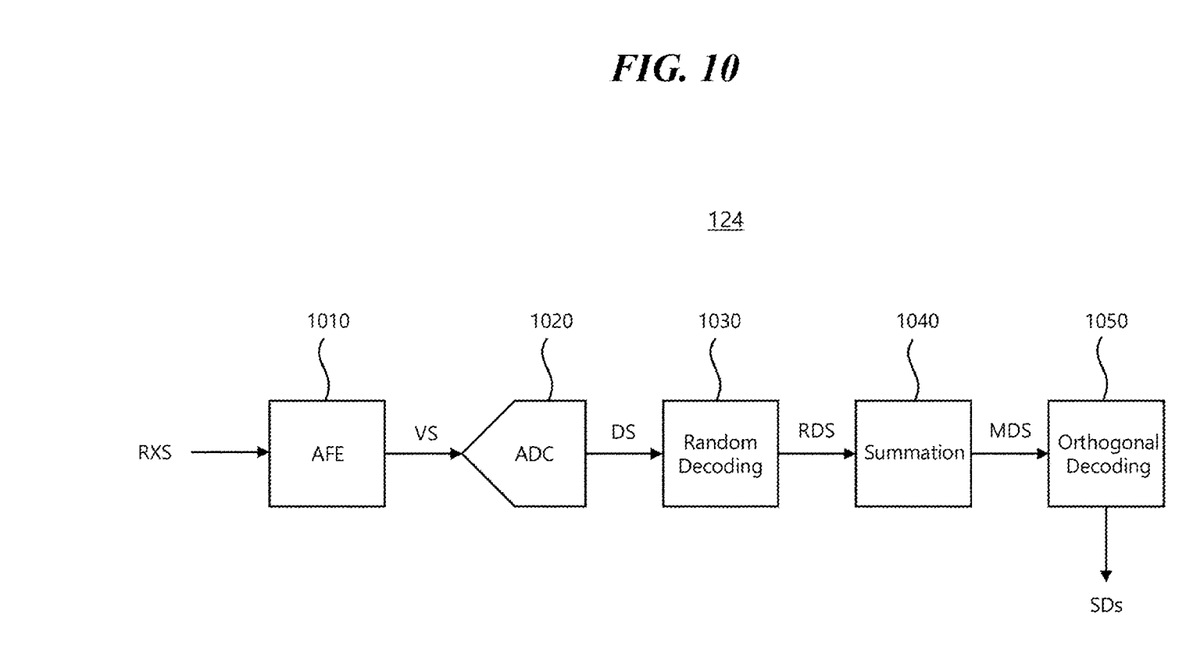
FIG. 10 is a block diagram of a sensing circuit according to an embodiment.

FIG. 10 is a block diagram of a sensing circuit according to an embodiment.

Referring to FIG. 10, the sensing circuit 124 may include an analog front-end circuit 1010, an analog-digital converter 1020, a spread spectrum code decoding circuit 1030, a summation circuit 1040, and an orthogonal decoding circuit 1050.

The analog front-end circuit 1010 may generate a sensing voltage (VS) by performing integration on a response signal (RXS).

Here, the response signal (RXS) corresponds to a response signal of a touch sensor for a driving signal. As described above, the driving signal may be a periodic pulse signal, and may include a high voltage level interval and a low voltage level interval.

The response signal (RXS) may have a part corresponding to the high voltage level interval and a part corresponding to the low voltage level interval, wherein the parts corresponding to the respective intervals may have different polarities.

The analog front-end circuit 1010 may reverse a part of the response signal (RXS), the part corresponding to the high voltage level interval or the low voltage level interval, and then perform integration on the response signal (RXS).

A circuit which reverses one of two polarity parts to cause two polarities to be identical to each other is also called a correlated double sampling (CDS) circuit, wherein the analog front-end circuit 1010 may reverse the part of the response signal (RXS), the part corresponding to the high voltage level interval or the low voltage level interval, by using the CDS circuit.

The front end of the analog front-end circuit 1010 may have a second MUX circuit disposed thereat, wherein the driving circuit may select one of multiple TX groups by using a first MUX circuit, and the sensing circuit 124 may select one of multiple reception electrodes by using the second MUX circuit.

The analog front-end circuit 1010 may be included in the readout circuit described above with reference to FIG. 2.

The analog-digital converter 1020 may convert a sensing voltage (VS) into a digital response signal (DS). Here, the digital response signal (DS) corresponds to a signal having a digital value, and may mean digital data stored in a memory.

The spread spectrum code decoding circuit 1030 may decode the digital response signal (DS) with a spread spectrum code to generate a first decoding signal (RDS).

The summation circuit 1040 may summate first decoding signals (RDSs) at each unit time of orthogonal codes to generate a second decoding signal (MDS). Here, the unit time of the orthogonal codes may mean a time having a value in the orthogonal codes. For example, in the orthogonal codes, a time of a unit signal having 1 or 0 may be a unit time.

The orthogonal decoding circuit 1050 may decode the second decoding signal (MDS) with orthogonal codes to generate sensing data pieces (SDs).

Figure 11:
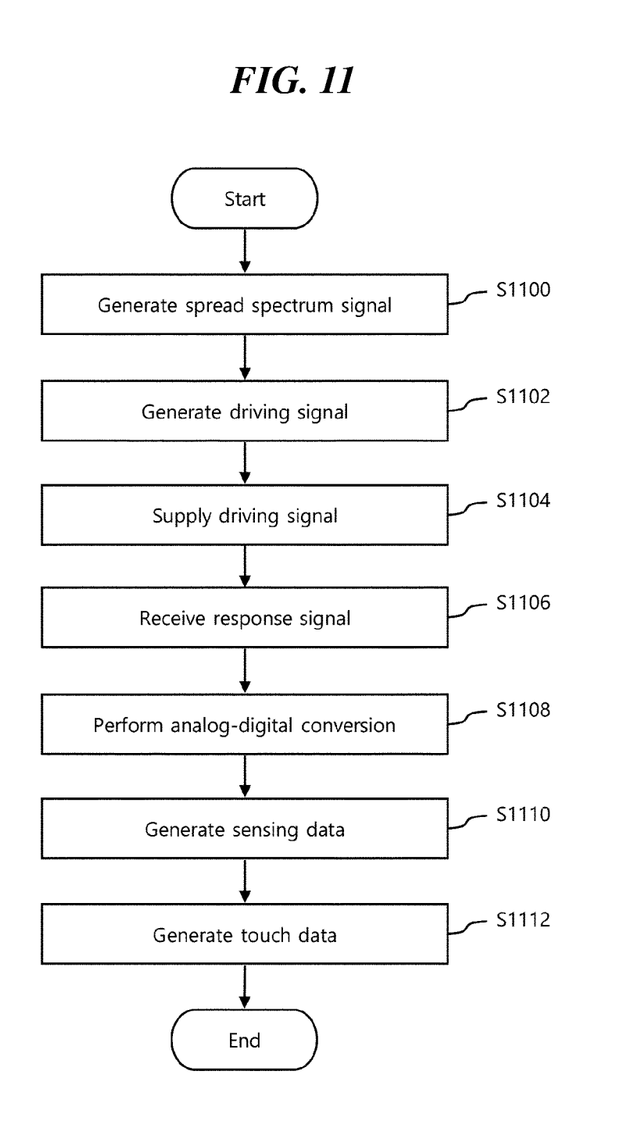
FIG. 11 is a flow chart illustrating a touch sensing method according to an embodiment.

FIG. 11 is a flow chart illustrating a touch sensing method according to an embodiment.

Referring to FIG. 11, a touch sensing device may code a base signal with a spread spectrum code to generate a spread spectrum signal (S1100).

The touch sensing device may code the spread spectrum signal with multiple orthogonal codes that are orthogonal to each other, so as to generate multiple driving signals (S1102).

The touch sensing device may supply the driving signals to each of transmission electrodes (S1104).

The touch sensing device may receive a response signal for the driving signals from a reception electrode (S1106).

The touch sensing device may convert the response signal into a digital response signal through analog-digital conversion (S1108).

The touch sensing device may decode the digital response signal with the orthogonal codes and the spread spectrum code to generate sensing data for each touch sensor (S1110).

The touch sensing device may determine a touch or proximity on or to touch sensors by an external object, by using the sensing data and generate touch data including touch coordinates (S1112).

As described above, according to the embodiment, touch sensing can be robust against noise according a spread spectrum code. According to the embodiment, multiple touch sensors are simultaneously driven using orthogonal codes, whereby a touch sensing time can be reduced or touch sensitivity can be enhanced.

What is claimed is:

1. A touch sensing method for mutual capacitance touch sensors formed by multiple transmission electrodes and a reception electrode intersecting each other, the method comprising:
   coding a base signal with a spread spectrum code to generate a spread spectrum signal;
   coding the spread spectrum signal with multiple orthogonal codes, which are orthogonal to each other, to generate multiple driving signals;
   supplying the driving signals to the transmission electrodes, respectively;
   receiving a response signal for the driving signals from the reception electrode;
   converting the response signal into a digital response signal through analog-digital conversion;
   decoding the digital response signal with the spread spectrum code to generate a first decoding signal;
   summating the first decoding signal at each unit time of the orthogonal codes to generate a second decoding signal;
   decoding the second decoding signal with the orthogonal codes to generate sensing data for each of the touch sensors; and
   determining a touch or proximity of an external object to the touch sensors by using the sensing data.

2. The touch sensing method of claim 1, wherein the spread spectrum code corresponds to a pseudo-noise (PN) code.

3. The touch sensing method of claim 1, wherein the base signal comprises a periodic pulse signal.

4. The touch sensing method of claim 1, wherein the orthogonal codes correspond to a Perfect code or a Hadamard code.

5. The touch sensing method of claim 1, wherein the spread spectrum code, as a pseudo-random code, corresponds to a maximum length sequence (MLS), a Parker code, or a Gold code.

6. A touch sensing device for mutual capacitance touch sensors formed by multiple transmission electrodes and a reception electrode intersecting each other, the touch sensing device comprising:
   a driving circuit configured to code a base signal with a spread spectrum code to generate a spread spectrum signal, to code the spread spectrum signal with multiple orthogonal codes, which are orthogonal to each other, to generate multiple driving signals, and to supply the driving signals to the transmission electrodes, respectively; and
   a sensing circuit configured to receive a response signal for the driving signals from the reception electrode, to convert the response signal into a digital response signal through analog-digital conversion, to decode the digital response signal with the orthogonal codes and the spread spectrum code to generate sensing data for each of the touch sensors, and to determine a touch or proximity of an external object to the touch sensors by using the sensing data,
   wherein the sensing circuit decodes the digital response signal with the spread spectrum code to generate a first decoding signal, summates the first decoding signal at each unit time of the orthogonal codes to generate a second decoding signal, and decodes the second decoding signal with the orthogonal codes to generate the sensing data.

7. The touch sensing device of claim 6, wherein the base signal corresponds to a periodic pulse signal and the driving circuit configures a high voltage level interval and a low voltage level interval of the pulse signal by using a counter.

8. The touch sensing device of claim 6, wherein the driving circuit comprises a first MUX (multiplexer) circuit configured to select one of multiple TX groups,
   the sensing circuit comprises a second MUX circuit configured to select one of multiple reception electrodes, and
   each TX group comprises two or more transmission electrodes.

9. The touch sensing device of claim 6, wherein the driving circuit performs an XOR operation on the base signal and a signal corresponding to the spread spectrum code to generate the spread spectrum signal.

10. The touch sensing device of claim 9, wherein the driving circuit performs an XOR operation on the spread spectrum signal and each of signals corresponding to the orthogonal codes to generate the driving signals.

11. The touch sensing device of claim 6, wherein the sensing circuit performs integration on the response signal to generate a sensing voltage and performs analog-digital conversion on the sensing voltage to generate the digital response signal.

12. The touch sensing device of claim 11, wherein a driving signal comprises unit signals each indicating 1 or 0 and the unit signals are classified into 1 or 0 according to polarity or a phase.

13. The touch sensing device of claim 12, wherein the unit signals are classified into 1 or 0 according to a phase and a dummy signal is further inserted into each unit signal.

14. The touch sensing device of claim 12, wherein the unit signals are classified into 1 or 0 according to a phase and a dummy signal is inserted between two unit signals having different values.

* * * * *